United States Patent
Chen

(10) Patent No.: US 9,343,322 B2
(45) Date of Patent: May 17, 2016

(54) THREE DIMENSIONAL STACKING MEMORY FILM STRUCTURE

(71) Applicant: Macronix International Co., Ltd., Hsinchu (TW)

(72) Inventor: Shih-Hung Chen, Jhudong Township (TW)

(73) Assignee: Macronix International Co., Ltd., Hsinchu (TW)

( * ) Notice: Subject to any disclaimer, the term of this patent is extended or adjusted under 35 U.S.C. 154(b) by 104 days.

(21) Appl. No.: 14/158,589

(22) Filed: Jan. 17, 2014

(65) Prior Publication Data

US 2015/0206882 A1    Jul. 23, 2015

(51) Int. Cl.

| G11C 5/06 | (2006.01) |
|---|---|
| H01L 21/308 | (2006.01) |
| G11C 7/00 | (2006.01) |
| H01L 21/3213 | (2006.01) |
| H01L 21/311 | (2006.01) |

(Continued)

(52) U.S. Cl.
CPC .............. H01L 21/308 (2013.01); G11C 7/00 (2013.01); *H01L 21/30604* (2013.01); *H01L 21/31111* (2013.01); *H01L 21/32133* (2013.01); *H01L 27/11519* (2013.01); *H01L 27/11548* (2013.01); *H01L 27/11556* (2013.01); *H01L 27/11565* (2013.01); *H01L 27/11575* (2013.01); *H01L 27/11582* (2013.01); *H01L 2924/0002* (2013.01)

(58) Field of Classification Search
CPC .............................. H01L 21/308; G11C 7/00
USPC ..................... 365/63, 185.05, 185.11, 185.06
See application file for complete search history.

(56) References Cited

U.S. PATENT DOCUMENTS

| 6,034,882 A | 3/2000 | Johnson et al. |
|---|---|---|
| 6,323,117 B1 | 11/2001 | Noguchi |
| 6,906,361 B2 | 6/2005 | Zhang |

(Continued)

FOREIGN PATENT DOCUMENTS

| EP | 1936681 A1 | 6/2008 |
|---|---|---|
| EP | 2048709 A2 | 4/2009 |

(Continued)

OTHER PUBLICATIONS

U.S. Appl. No. 14/038,526, "Contact Structure and Forming Method", filed Sep. 26, 2013.

(Continued)

*Primary Examiner* — Viet Q Nguyen
(74) *Attorney, Agent, or Firm* — Yiding Wu; Haynes Beffel & Wolfeld LLP

(57) ABSTRACT

A memory device includes a plurality of stacks of alternating active strips and insulating strips. The insulating strips have effective oxide thicknesses (EOT) so that the stacks have non-simple spatial periods on a line through the alternating active strips and insulating strips. A plurality of conductive lines are arranged orthogonally over, and have surfaces conformal with, the plurality of stacks, defining a multi-layer array of interface regions at cross-points between side surfaces of the active strips in the stacks and the conductive lines. Memory elements are disposed in the interface regions, which establish a 3D array of memory cells accessible via the plurality of active strips and the plurality of conductive lines. The insulating strips in the stacks can include a first group of strips having a first EOT and a second group of strips having a second EOT that is greater than the first EOT.

24 Claims, 13 Drawing Sheets

(51) Int. Cl.
*H01L 21/306* (2006.01)
*H01L 27/115* (2006.01)

(56) References Cited

U.S. PATENT DOCUMENTS

| | | | |
|---|---|---|---|
| 6,906,940 B1 | 6/2005 | Lue | |
| 7,018,783 B2 | 3/2006 | Iwasaki et al. | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,274,594 B2 | 9/2007 | Pascucci et al. | |
| 7,315,474 B2 | 1/2008 | Lue | |
| 7,382,647 B1 | 6/2008 | Gopalakrishnan | |
| 7,420,242 B2 | 9/2008 | Lung | |
| 7,696,559 B2 | 4/2010 | Arai et al. | |
| 7,851,849 B2 | 12/2010 | Kiyotoshi | |
| 7,863,672 B2 * | 1/2011 | Jin | H01L 21/28273 257/319 |
| 7,979,758 B2 | 7/2011 | Hur et al. | |
| 8,225,150 B2 | 7/2012 | Hur et al. | |
| 8,331,149 B2 * | 12/2012 | Choi | G11C 16/0466 257/329 |
| 8,363,476 B2 | 1/2013 | Lue et al. | |
| 8,383,512 B2 | 2/2013 | Chen et al. | |
| 8,467,219 B2 | 6/2013 | Lue | |
| 8,503,213 B2 | 8/2013 | Chen et al. | |
| 8,541,882 B2 | 9/2013 | Chen et al. | |
| 8,587,998 B2 * | 11/2013 | Hung | G11C 16/0483 365/130 |
| 8,598,032 B2 * | 12/2013 | Chen | H01L 27/11286 257/E23.169 |
| 8,633,099 B1 * | 1/2014 | Shih | H01L 21/76805 257/758 |
| 8,716,780 B2 * | 5/2014 | Kellam | G11C 5/02 257/314 |
| 8,735,967 B2 * | 5/2014 | Lim | H01L 27/11565 257/326 |
| 8,736,069 B2 | 5/2014 | Chiu et al. | |
| 8,759,899 B1 | 6/2014 | Lue et al. | |
| 8,811,077 B2 | 8/2014 | Hung et al. | |
| 8,829,646 B2 * | 9/2014 | Lung | H01L 27/101 257/5 |
| 8,928,149 B2 * | 1/2015 | Chen | H01L 21/76816 257/734 |
| 8,951,862 B2 * | 2/2015 | Chen | H01L 29/7926 257/324 |
| 8,970,040 B1 * | 3/2015 | Chen | H01L 21/76838 257/211 |
| 8,987,098 B2 * | 3/2015 | Chen | H01L 27/11578 257/E27.07 |
| 9,070,447 B2 * | 6/2015 | Chen | G11C 16/0483 |
| 2004/0023499 A1 | 2/2004 | Hellig et al. | |
| 2004/0188822 A1 | 9/2004 | Hara | |
| 2005/0280061 A1 | 12/2005 | Lee | |
| 2007/0045708 A1 | 3/2007 | Lung | |
| 2007/0090434 A1 | 4/2007 | Davies et al. | |
| 2007/0140001 A1 | 6/2007 | Motoi et al. | |
| 2007/0231750 A1 | 10/2007 | Parikh | |
| 2007/0252201 A1 | 11/2007 | Kito et al. | |
| 2008/0073635 A1 | 3/2008 | Kiyotoshi et al. | |
| 2008/0096327 A1 | 4/2008 | Lee et al. | |
| 2008/0101109 A1 | 5/2008 | Haring-Bolivar et al. | |
| 2008/0175032 A1 | 7/2008 | Tanaka et al. | |
| 2008/0180994 A1 | 7/2008 | Katsumata et al. | |
| 2008/0247230 A1 | 10/2008 | Lee et al. | |
| 2008/0285350 A1 | 11/2008 | Yeh | |
| 2009/0001530 A1 | 1/2009 | Goto | |
| 2009/0032966 A1 | 2/2009 | Lee et al. | |
| 2009/0097321 A1 | 4/2009 | Kim et al. | |
| 2009/0184360 A1 | 7/2009 | Jin et al. | |
| 2010/0007001 A1 | 1/2010 | Wang et al. | |
| 2010/0054015 A1 | 3/2010 | Lee et al. | |
| 2010/0109164 A1 | 5/2010 | Kang et al. | |
| 2010/0133645 A1 | 6/2010 | Dunne | |
| 2010/0182041 A1 | 7/2010 | Feng et al. | |
| 2010/0225000 A1 | 9/2010 | Sugizaki et al. | |
| 2010/0270593 A1 | 10/2010 | Lung et al. | |
| 2011/0031630 A1 | 2/2011 | Hashimoto | |
| 2011/0057321 A1 | 3/2011 | Wang et al. | |
| 2011/0116309 A1 | 5/2011 | Lung | |
| 2011/0235408 A1 | 9/2011 | Minemura et al. | |
| 2012/0119283 A1 | 5/2012 | Lee et al. | |
| 2012/0182806 A1 | 7/2012 | Chen et al. | |
| 2013/0016572 A1 | 1/2013 | Kuroda | |
| 2013/0082341 A1 | 4/2013 | Shimizu et al. | |
| 2013/0341797 A1 | 12/2013 | Lim | |
| 2014/0053979 A1 | 2/2014 | Chen et al. | |
| 2014/0198576 A1 | 7/2014 | Hung et al. | |
| 2015/0357342 A1 * | 12/2015 | Lee | H01L 27/11582 257/324 |

FOREIGN PATENT DOCUMENTS

| | | |
|---|---|---|
| EP | 2192612 A2 | 6/2010 |
| TW | I308374 B | 4/2009 |
| TW | 201123266 A | 7/2011 |

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

Choi et al., "3D approaches for non-volatile memory", 2011 Symposium on VLSI Technology, Digest of Technical Papers, pp. 178-179, Jun. 14-16, 2011.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Extended European Search Report for EP 12170759, dated Feb. 5, 2013, 12 pages.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hu J. et al., "Reducing Write Activities on Non-volatile Memories in Embedded CMPs via Data Migration and Recomputation," Proc. of the IEEE/ACM DAC, pp. 350-355, 2010.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Antifuse Memory Cells," IEEE Journal of Solid-State Circuits, vol. 38, No 11, Nov. 2003, pp. 1920-1928.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

(56) References Cited

OTHER PUBLICATIONS

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Nowak et al., "Intrinsic fluctuations in Vertical NAND flash memories," 2012 Symposium on VLSI Technology, Digest of Technical Papers, pp. 21-22, Jun. 12-14, 2012.

Paul et al., "Impact of a Process Variation on Nanowire and Nanotube Device Performance," IEEE Trans. on Electron Devices, vol. 54, No. 9, Sep. 2007, pp. 2369-2376.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

\* cited by examiner

THREE DIMENSIONAL STACKING MEMORY FILM STRUCTURE

BACKGROUND

1. Field of the Invention

The present invention relates to high density integrated circuit devices, and more particularly to interconnect structures for multi-level three-dimensional stacked devices.

2. Description of Related Art

High density memory devices are being designed that comprise arrays of flash memory cells, or other types of memory cells. In some examples, the memory cells comprise thin film transistors which can be arranged in three dimensional (3D) architectures.

In one example, a 3D memory device includes a plurality of stacks of strings of memory cells. The stacks include active strips separated by insulating material. The 3D memory device includes an array including a plurality of word lines structures, a plurality of string select structures, and ground select lines, arranged orthogonally over the plurality of stacks. Memory cells including charge storage structures are formed at cross-points between side surfaces of the active strips in the plurality of stacks and the word lines structures.

The 3D memory device is characterized by multiple planes, each of which can include a planar array of active strips. Interference between active strips in adjacent planes, and variations in amounts of interference experienced in different planes can affect device performance.

It is desirable to provide a device structure for reducing the interference and variations in amounts of interference experienced in different planes for three-dimensional memory devices.

SUMMARY

A memory device includes a plurality of stacks of alternating active strips and insulating strips. The insulating strips have effective oxide thicknesses (EOT) so that the stacks have non-simple spatial periods on a line through the alternating active strips and insulating strips. A plurality of conductive lines are arranged orthogonally over, and have surfaces conformal with, the plurality of stacks, defining a multi-layer array of interface regions at cross-points between side surfaces of the active strips in the stacks and the conductive lines. Memory elements are disposed in the interface regions, which establish a 3D array of memory cells accessible via the plurality of active strips and the plurality of conductive lines. The insulating strips in the stacks can include a first group of strips having a first EOT and a second group of strips having a second EOT that is greater than the first EOT. The insulating strips in the stacks can alternate in thickness between a first EOT and a second EOT that is greater than the first EOT. A ratio of the second EOT to the first EOT can be between 1.2 and 3.

The first EOT can be between 15 nanometers and 30 nanometers. The second EOT can be between 25 nanometers and 50 nanometers. A thickness of the first active strip or the second active strip can be between 15 nanometers and 30 nanometers.

A method for manufacturing a memory device as described herein is also provided.

Other aspects and advantages of the present invention can be seen on review of the drawings, the detailed description and the claims, which follow.

DETAILED DESCRIPTION

Figure 1:
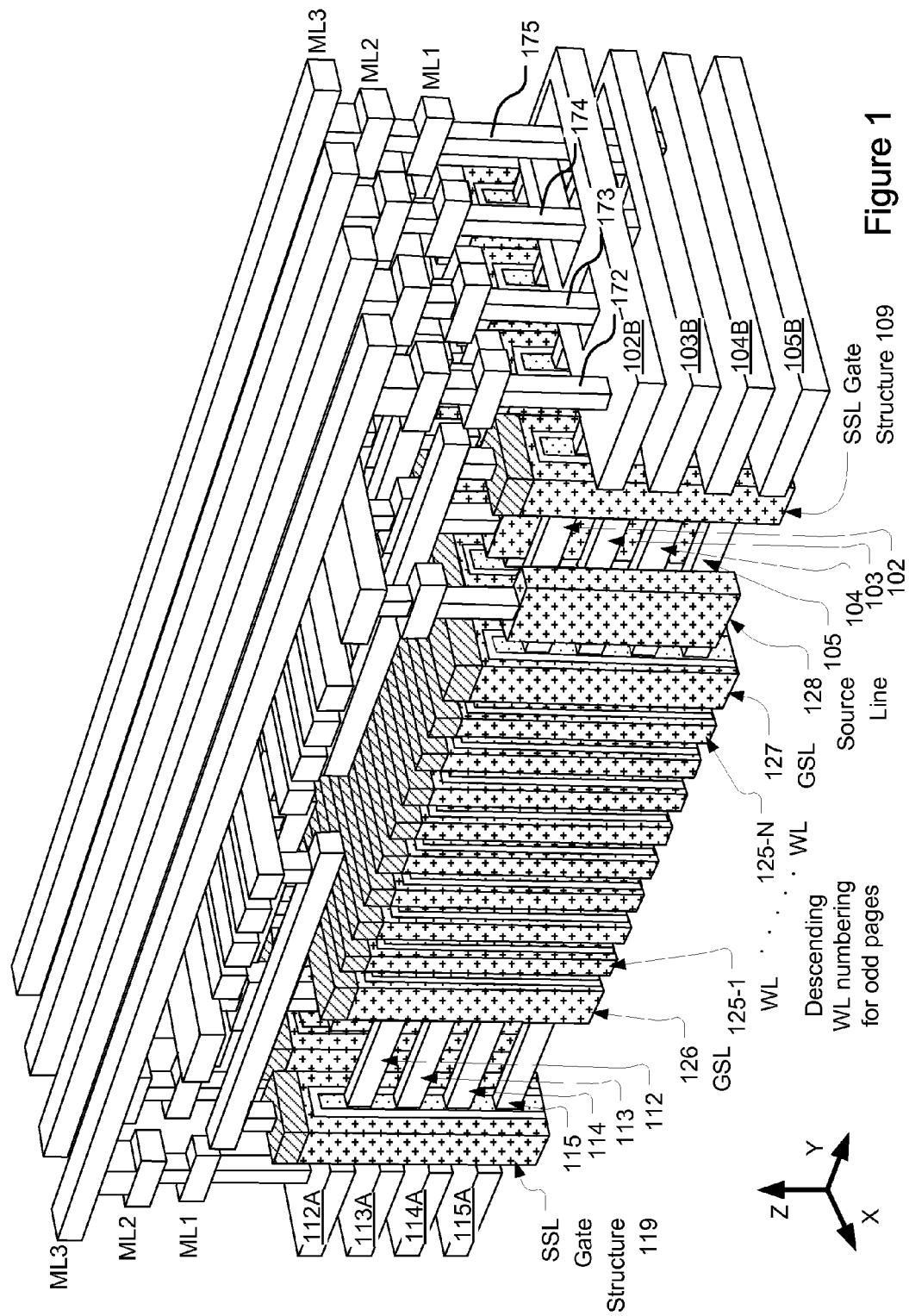
FIG. 1 is a perspective illustration of a three-dimensional (3D) integrated circuit device.

A detailed description of embodiments of the present invention is provided with reference to the figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a perspective illustration of a three-dimensional (3D) integrated circuit device. The device illustrated in FIG. 1 includes a plurality of stacks of active strips alternating with insulating strips. Insulating material is removed from the drawing to expose additional structure. For example, insulating strips are removed between the active strips in the stacks, and are removed between the stacks of active strips. This structure is described herein in some detail, as an example of a three-dimensional (3D) memory array which can be manufactured on a semiconductor substrate, in combination with peripheral circuits on the substrate (not shown). Other multi-layer circuit structures can also be formed using the technology described herein.

In the example shown in FIG. 1, a multilayer array is formed on an insulating layer, and includes a plurality of word lines 125-1 WL through 125-N WL conformal with the plurality of stacks. The plurality of stacks includes active strips 112, 113, 114, and 115 in multiple planes. Active strips in the same plane are electrically coupled together by contact pads (e.g. 102B).

A contact structure including a stack of contact pads 112A, 113A, 114A, and 115A terminate active strips, such as the active strips 112, 113, 114, and 115 in the plurality of stacks. As illustrated, these contact pads 112A, 113A, 114A, and 115A are electrically connected to different bit lines for connection to decoding circuitry to select planes within the array.

These contact pads 112A, 113A, 114A, and 115A can be patterned at the same time that the plurality of stacks is defined.

A contact structure including a stack of contact pads 102B, 103B, 104B, and 105B terminate active strips, such as active strips 102, 103, 104, and 105. As illustrated, interlayer connectors 172, 173, 174, 175 electrically connect contact pads 102B, 103B, 104B, and 105B to different bit lines in metal layers, such as a metal layer ML3, for connection to decoding circuitry to select planes within the array. The stack of contact pads 102B, 103B, 104B, and 105B can be patterned at the same time that the plurality of stacks is defined.

Any given stack of active strips is coupled to either the stack of contact pads 112A, 113A, 114A, and 115A, or the stack of contact pads 102B, 103B, 104B, and 105B, but not both. The stack of active strips 112, 113, 114, and 115 is terminated at one end by the stack of contact pads 112A, 113A, 114A, and 115A, passes through SSL gate structure 119, ground select line GSL 126, word lines 125-1 WL through 125-N WL, ground select line GSL 127, and is terminated at the other end by source line 128. The stack of active strips 112, 113, 114, and 115 does not reach the stack of contact pads 102B, 103B, 104B, and 105B.

The stack of active strips 102, 103, 104, and 105 is terminated at one end by the stack of contact pads 102B, 103B, 104B, and 105B, passes through SSL gate structure 109, ground select line GSL 127, word lines 125-N WL through 125-1 WL, ground select line GSL 126, and is terminated at the other end by a source line (obscured by other parts of the figure). The stack of active strips 102, 103, 104, and 105 does not reach the stack of contact pads 112A, 113A, 114A, and 115A.

A layer of memory material is disposed in interface regions at cross-points between surfaces of the active strips 112-115 and 102-105 and the plurality of word lines 125-1 WL through 125-N WL. In particular, the layer of memory material is formed on side walls of the active strips in the plurality of stacks. Ground select lines GSL 126 and GSL 127 are conformal with the plurality of stacks, similar to the word lines.

Every stack of active strips is terminated at one end by contact pads and at the other end by a source line. For example, the stack of active strips 112, 113, 114, and 115 is terminated at one end by contact pads 112A, 113A, 114A, and 115A, and terminated on the other end by a source line 128. At the near end of the figure, every other stack of active strips is terminated by the contact pads 102B, 103B, 104B, and 105B, and every other stack of active strips is terminated by a separate source line. At the far end of the figure, every other stack of active strips is terminated by the contact pads 112A, 113A, 114A, and 115A, and every other stack of active strips is terminated by a separate source line.

Bit lines and string select gate structures are formed at the metals layers ML1, ML2, and ML3. Bit lines are coupled to a plane decoder (not shown). String select gate structures are coupled to a string select line decoder (not shown).

The ground select lines GSL 126 and 127 can be patterned during the same step that the word lines 125-1 WL through 125-N WL are defined. Ground select devices are formed at cross-points between surfaces of the plurality of stacks and ground select lines GSL 126 and 127. The SSL gate structures 119 and 109 can be patterned during the same step in which the word lines 125-1 WL through 125-N WL are defined. String select devices are formed at cross-points between surfaces of the plurality of stacks and string select (SSL) gate structures 119 and 109. These devices are coupled to decoding circuitry for selecting the strings within particular stacks in the array.

Figure 1A:
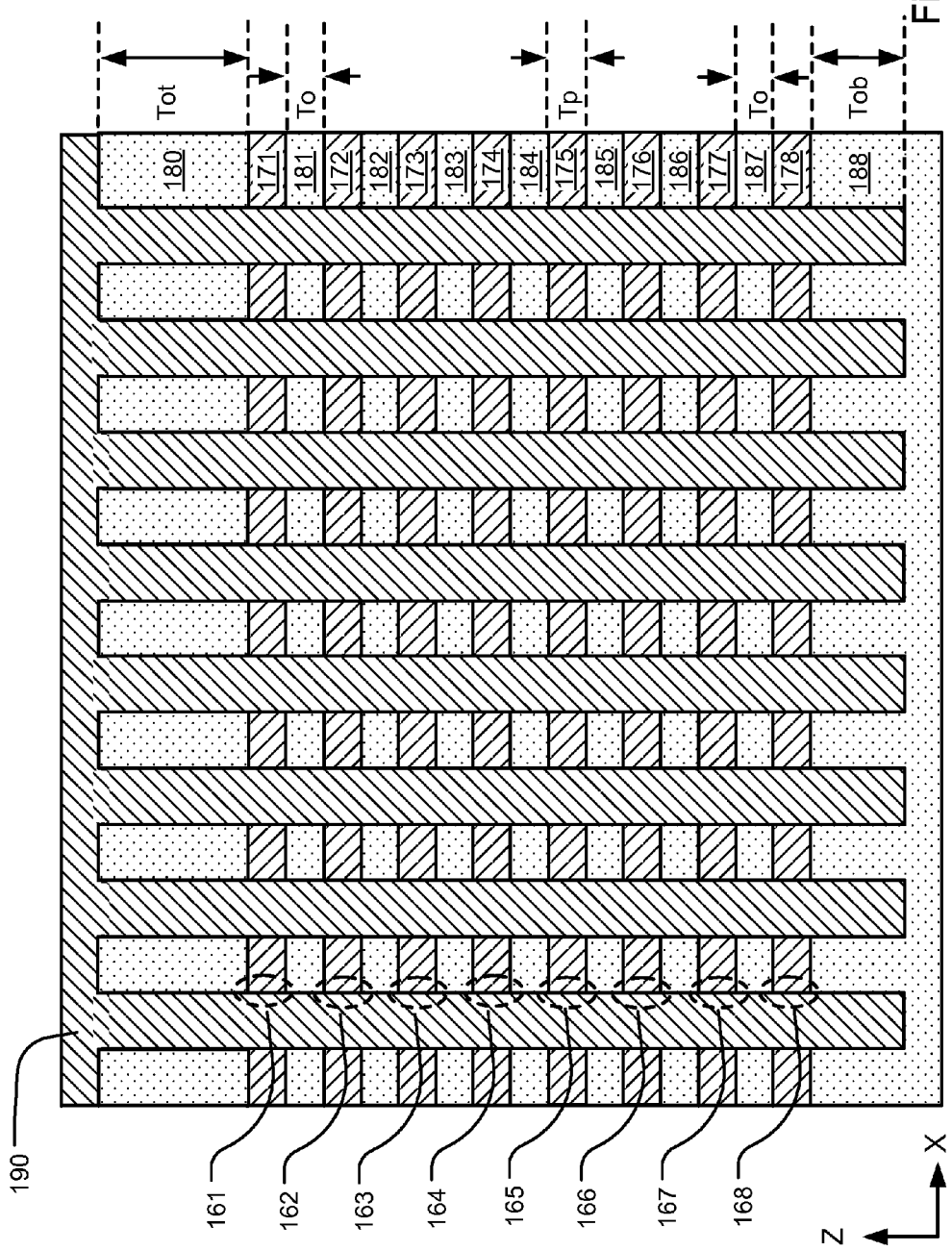
FIG. 1A illustrates a plurality of stacks of alternating active strips and insulating strips, where the insulating strips have a same thickness.

FIG. 1A illustrates a plurality of stacks of alternating active strips (e.g. 171-178) and insulating strips (e.g. 181-187), corresponding to a cross section of the device shown in FIG. 1 in the X-Z plane, taken along a word line (e.g. 125-N WL, FIG. 1). The active strips have a thickness Tp, and the insulating strips have a thickness To. The thickness To is the same for the insulating strips in the stacks (e.g. 181-187). Top insulating strips (e.g. 180) disposed on the stacks have a thickness Tot greater than the thickness To of the insulating strips in the stacks. Bottom insulating strips (e.g. 188) disposed between the stacks and a semiconductor substrate (not shown) have a thickness Tob greater than the thickness To of the insulating strips in the stacks.

A plurality of conductive lines (e.g. 190) are arranged orthogonally over, and having surfaces conformal with, the plurality of stacks, defining an multi-layer array of interface regions at cross-points between side surfaces of the active strips in the stacks and the conductive lines. Memory cells (e.g. 161-168) can be established in multiple layers with memory elements disposed in the interface regions, and be accessible via the plurality of active strips and the plurality of conductive lines.

Memory cells in the top layer in the multi-layer array (e.g. 161) experience interference from memory cells in a lower layer (e.g. 162). Memory cells in the bottom layer in the multi-layer array (e.g. 168) experience interference from memory cells in an upper layer (e.g. 167). Memory cells in layers between the top layer and the bottom layer (e.g. 164) experience interference from both lower layers (e.g. 165) and upper layers (e.g. 163). Variations in amounts of interference in different layers in the multi-layer array can induce issues in threshold distribution such as narrower sensing windows.

Interference between memory cells in adjacent layers can vary depending on thicknesses of insulating material between the adjacent layers. Interference can be reduced when thicker insulating strips are used or can even become negligible if insulating strips are thick enough. Interference can affect device performance in a stacked memory structure. For instance, a programming operation for a selected memory cell can disturb the data stored in neighboring cells. Programming operations for reducing program disturb in a stacked memory structure are described in U.S. patent application Ser. No. 13/827,475 filed on Mar. 14, 2013, which application is incorporated by reference as if fully set forth herein.

Figure 2:
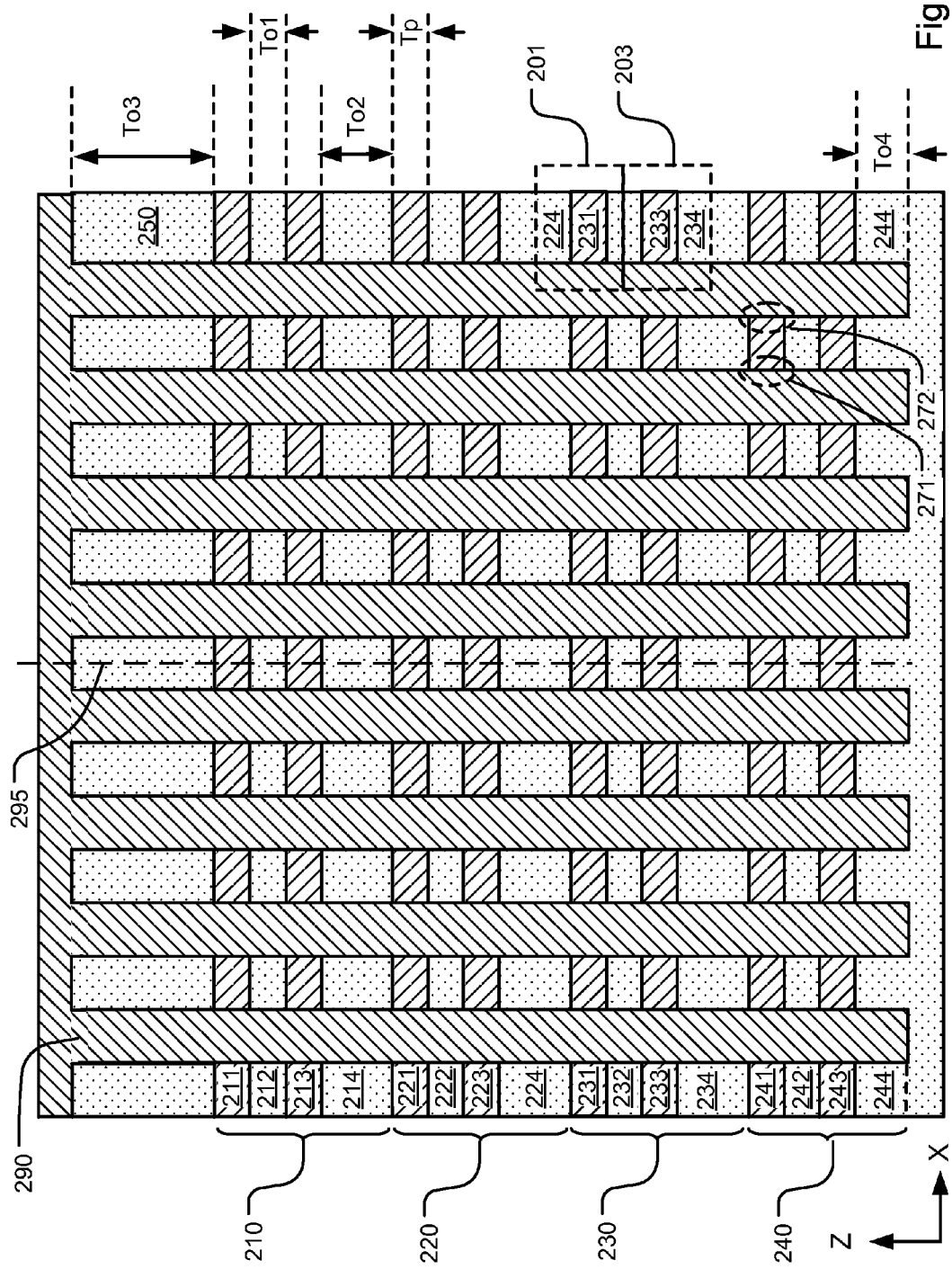
FIG. 2 illustrates a plurality of stacks of alternating active strips and insulating strips, where the insulating strips have non-simple spatial periods.

FIG. 2 illustrates a plurality of stacks of alternating active strips (e.g. 211, 213, 221, 223, 231, 233, 241, 243) and insulating strips (e.g. 212, 214, 222, 224, 232, 234, 242, 244), where the insulating strips have effective oxide thicknesses (EOT) so that the stacks have non-simple spatial periods on a line (e.g. 295) through alternating active strips and insulating strips. FIG. 2 corresponds to a cross section of the device shown in FIG. 1 in the X-Z plane, taken along a word line (e.g. 125-N WL, FIG. 1).

A plurality of conductive lines (e.g. 290) is arranged orthogonally over, and having surfaces conformal with, the plurality of stacks, defining an multi-layer array of interface regions at cross-points between side surfaces of the active strips in the stacks and the conductive lines (e.g. 271, 272). Memory elements (not shown) are disposed in the interface regions, which establish a 3D array of memory cells accessible via the plurality of active strips and the plurality of conductive lines.

The insulating strips in the stacks include a first group of strips (e.g. 212, 222, 232, 242) having a first EOT (e.g. To1)

and a second group of strips (e.g. 214, 224, 234) having a second EOT (e.g. To2) that is greater than the first EOT. The insulating strips in the stacks alternate in thickness between the first EOT (e.g. To1) and the second EOT (e.g. To2) that is greater than the first EOT. The second EOT (e.g. To2) is greater than a thickness of the active strips (e.g. Tp).

A top insulating layer (e.g. 250) on the stacks has a third EOT (e.g. To3), and a bottom insulating layer (244) below the stacks has a fourth EOT (e.g. To4). The third EOT (e.g. To3) is greater than the second EOT (e.g. To2), so as to help reduce the effect of the vertical electric field from above the stacks on top surfaces of top active strips in the stacks (e.g. 211). The effect can include the tri-gate effect where top surfaces of top active strips in the stacks (e.g. 211) are inverted. Fringe electric field effect from a conductive line (e.g. 290) on an active strip (e.g. 231) through a thicker insulating strip (e.g. 224) is higher than fringe electric field effect from the conductive line through a thinner insulating strip (e.g. 232). Each active strip is in-between an insulating strip having the first EOT and another insulating strip having a thickness that is greater than the first EOT. An active strip at the bottom of a stack of alternating active strips and insulating strips (e.g. 243) is in-between an insulating strip having the first EOT on its top side and another insulating strip on its bottom side having the fourth EOT (e.g. To4). The fourth EOT can be designed to be half of the second EOT, for symmetry with insulating strips having the second EOT and shared between active strips above and below the insulating strips. However, due to process variations, such fourth EOT may be manufactured to be less than half of the second EOT and thus increase the distribution of fringe electric field. In order to narrow the distribution of fringe electric field variation due to process variations, the fourth EOT can be designed to be greater than the second EOT. The fourth EOT is greater than the first EOT (e.g. To1), and greater than the thickness of the first active strips or the second active strips (e.g. Tp).

A ratio of the second EOT to the first EOT can be between 1.2 and 3. The first EOT can be between 15 nanometers and 30 nanometers. The second EOT can be between 25 nanometers and 50 nanometers. The third EOT can be between 60 nanometers and 150 nanometers. The fourth EOT can be between 20 nanometers and 50 nanometers. A thickness of the first active strip or the second active strip can be between 15 nanometers and 30 nanometers.

As used in the present application, the term "effective oxide thickness" (EOT) means that by using insulating materials with different dielectric constants, the actual thicknesses of the insulating materials can be designed for the same electrical performance. For instance, an insulating layer can be designed using silicon dioxide (SiO2) with a particular thickness, or can be designed with a thinner thickness using an insulating material with a dielectric constant less than that of SiO2, to achieve the same electrical performance as when using SiO2 with the particular thickness. Values of thicknesses for insulating layers or insulating strips described herein are for insulating layers or insulating strips made of SiO2.

As used in the present application, the term "non-simple spatial period" means that for the same etch process, at least one of (1) the active layers have different etch times, or (2) the insulating layers have different etch times, typically because the active and/or insulating layers are made of different materials with different etching characteristics, or different thicknesses, or a combination of different materials and different thicknesses for the active and/or insulating layers. A stack of alternating active strips and insulating strips can have a first group of insulating strips made of a first material and having a first EOT, and a second group of insulating strips made of a second material and having a second EOT. The first material and the second material can be the same or different. Given the first and second materials and the first and second EOTs, actual thicknesses of the first group of insulating strips and actual thicknesses of the second group of insulating strips can be designed to achieve different etch times such that the first group of insulating strips and the second group of insulating strips have non-simple spatial periods.

The stacks of alternating active strips and insulating strips can establish a plurality of sub-stacks (e.g. 210, 220, 230, 240), where each sub-stack includes a first insulating strip (e.g. 212, 222, 232, 242) between a first active strip (e.g. 211, 221, 231, 241) and a second active strip (e.g. 213, 223, 233, 243), and a second insulating strip (e.g. 214, 224, 234, 244) below the second active strip. The second insulating strip have the second EOT (e.g. To2) greater than the first EOT (e.g. To1).

The 3D array of memory cells can establish a plurality of stacks of alternating first cell units (e.g. 201) and second cell units (e.g. 203). The first cell units include the first active strips (e.g. 231), an upper portion of the first insulating strip below the first active strips (e.g. 232) and a lower portion of the second insulating strip above the first cell units (e.g. 224). The second cell units include the second active strips (e.g. 233), a lower portion of the first insulating strip above the second cell units (e.g. 232) and an upper portion of the second insulating strip below the second cell units (e.g. 234).

The first cell units and the second cell units can be referred to as mirror units, in the sense that memory cells in a particular layer, whether the particular layer corresponds to the first cell units or the second cell units, experience less interference from memory cells in a first adjacent layer than interference from memory cells in a second adjacent layer. Here one of the first and second adjacent layers is above the particular layer, and another of the first and second adjacent layers is below the particular layer. Consequently, a device using mirror units as described in connection with FIG. 2 can reduce variations in amounts of interference in different layers in the multi-layer array as described in connection with FIG. 1A.

Because the second EOT (e.g. To2) is greater than the first EOT (e.g. To1), the second EOT can provide a larger process window for better aligning landing positions, reducing the chance for landing errors to occur as described in connection with FIGS. 4A-4D.

Also because the second EOT (e.g. To2) is greater than the first EOT (e.g. To1), interference between adjacent layers can be reduced, such that an active layer (e.g. 213) can be affected less by an adjacent active layer below (e.g. 221) than by another adjacent active layer above (e.g. 211). Likewise, an active layer (e.g. 231) can be affected less by an adjacent active layer above (e.g. 223) than by another adjacent active layer below (e.g. 233).

If the first EOT is increased to as thick as the second EOT, interference can be further reduced between a particular active layer and adjacent layers both below and above. However, the increased thickness of the first EOT can increase the aspect ratio of vias in the stack, and thus more likely to cause process issues such as bending. The aspect ratio is a ratio of a height (e.g. H, FIG. 9) over a width (e.g. W, FIG. 9) of a via in the stack (e.g. 880, FIG. 9). The device as described herein can provide a balanced approach between reducing interference between adjacent active layers for operation and controlling the aspect ratio of vias in the stack for manufacturing.

Figure 3:
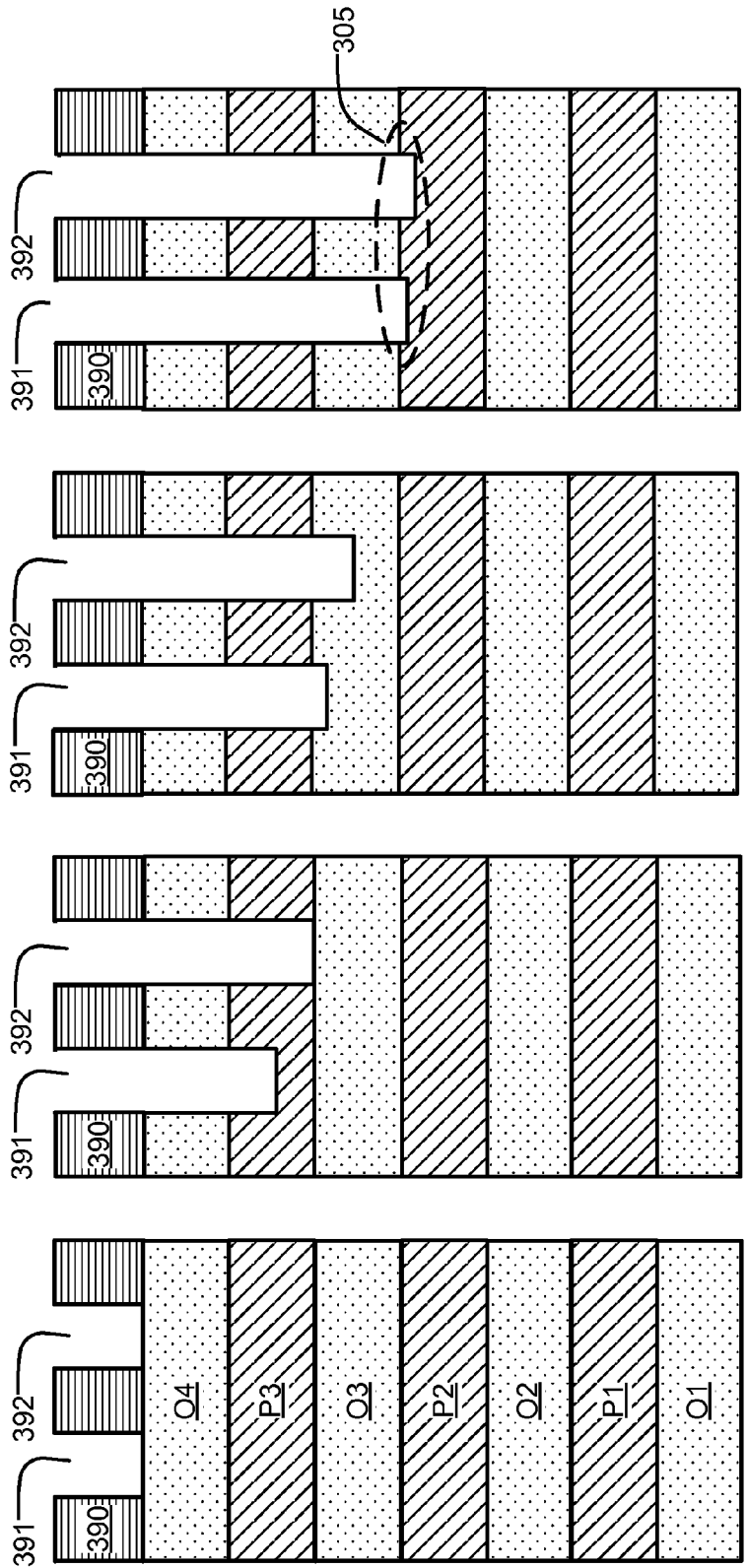
FIGS. 3A-3D illustrate an etch process.

FIGS. 3A-3D illustrate an etch process. As illustrated in the example of FIG. 3A, a stack including alternating active layers (e.g. P1-P3) and insulating layers (e.g. O1-O3) is formed. A top insulating layer (e.g. O4) is formed on the stack, and an etch mask (e.g. 390) with mask openings (e.g. 391, 392) is formed on the top insulating layer. The etch process includes a main etch step, a first over etch step, and a second over etch step, to etch vias through two insulating layers (e.g. O4, O3) and one active layer (e.g. P3), and to stop on another active layer (e.g. P2).

FIG. 3B shows the structure of FIG. 3A after etching the top insulating layer O4 and active layer P3 at the mask openings 391 and 392, using the main etch step. A uniformity issue in etching is caused by variations in thicknesses of active layers, variations in thicknesses of insulating layers, and variations in etching rate. Because of the uniformity issue, the main etch step may not stop at the same depth for vias corresponding to the mask openings. As illustrated in FIG. 3B, a via etched by the main etch step at mask opening 392 is closer to the surface of the insulator layer O3 than another via etched by the main etch step at mask opening 391.

FIG. 3C shows the structure of FIG. 3B after further etching the vias at mask openings 391 and 392 into the insulating layer O3, using the first over etch step. Because of the uniformity issue, the first over etch step may not stop at the same depth within the insulating layer O3 for vias corresponding to the mask openings.

FIG. 3D shows the structure of FIG. 3C after further etching the vias at mask openings 391 and 392 to stop on the target active layer P2, using the second over etch step. The second over etch step has a higher selectivity than the main etch step and the first over etch step, to help align landing positions (e.g. 305) on the target active layers (e.g. P2). As illustrated in FIG. 3D, variations in depths between vias corresponding to mask openings (e.g. 391, 392) are further reduced with the second over etch step than with the first over etch step as illustrated in FIG. 3C.

Thus, the main etch step removes most of the materials in active layers and insulating layers for vias to stop within about one insulating layer from the target active layers, while variations in depths after the main etch step among the vias corresponding to different mask openings can be reduced by using one or more over etch steps with higher selectivity than the main etch step.

Figure 4:
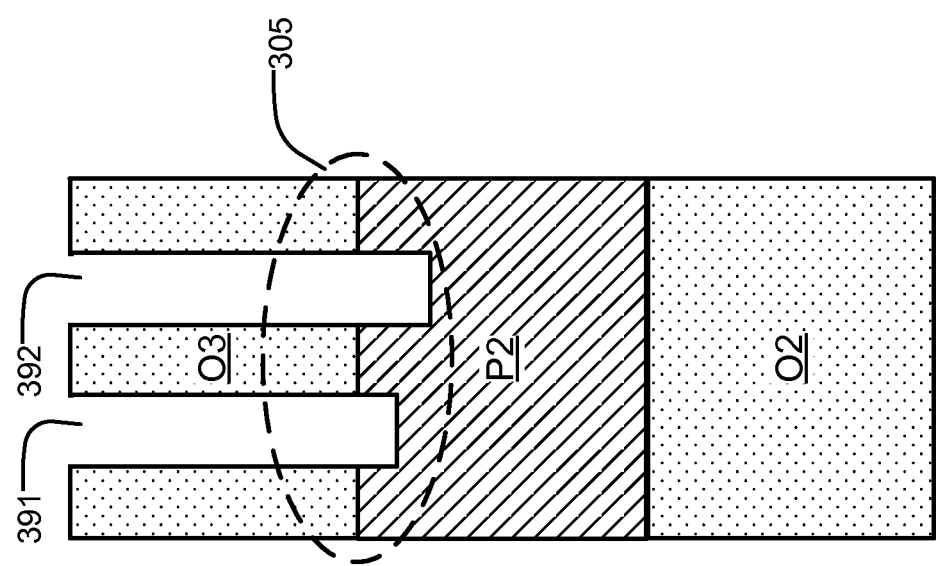
FIG. 4 illustrates an enlarged view of landing positions on the target active layers.

FIG. 4 illustrates an enlarged view of landing positions on the target active layers. As illustrated in the example of FIG. 4, variations in depths can still exist among the vias even with etch steps of higher selectivity to help align landing positions (e.g. 305). When the active layers and the insulating layers are sufficiently thick, such variations in depths are less likely to cause landing errors, where vias are mistakenly etched to stop on active layers other than the target active layer.

Figure 5:
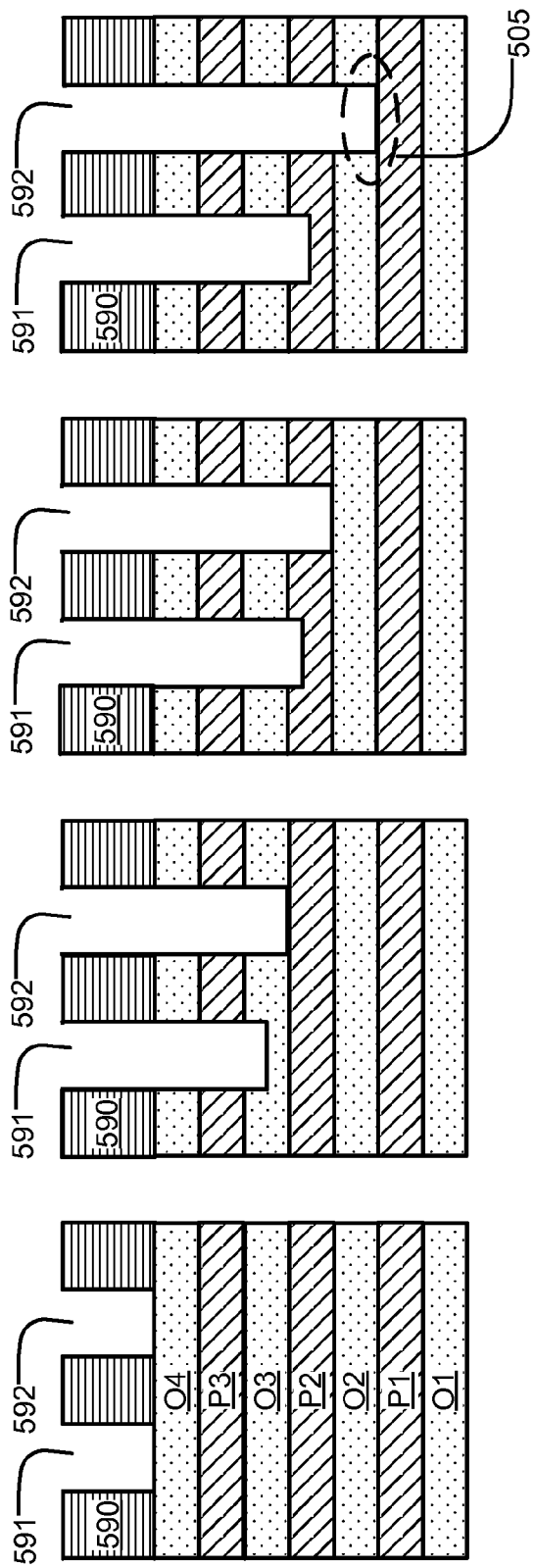
FIGS. 5A-5D illustrate an etch process on thinner layers than on layers in FIGS. 3A-3D.

FIGS. 5A-5D illustrate an etch process on thinner active layers and insulating layers than on corresponding layers illustrated in FIGS. 3A-3D. As illustrated in the example of FIG. 5A, a stack including alternating active layers (e.g. P1-P3) and insulating layers (e.g. O1-O3) is formed. A top insulating layer (e.g. O4) is formed on the stack, and an etch mask (e.g. 590) with mask openings (e.g. 591-592) is formed on the top insulating layer. As with the etch process illustrated in FIG. 3A-3D, the etch process illustrated in FIGS. 5A-5D includes a main etch step, a first over etch step, and a second over etch step, to etch vias through 2 insulating layers (e.g. O4, O3) and 1 active layer (e.g. P3), and to stop on another active layer (e.g. P2).

Given the uniformity issue in etching as described in connection with FIGS. 3A-3D, the same variations in thicknesses of active and insulating layers and the same variations in etching rate can lead to landing errors, when the etch process is applied on thinner active layers and insulating layers than on corresponding layers as illustrated in FIGS. 3A-3D.

FIG. 5B shows the structure of FIG. 5A after etching the top insulating layer O4 and active layer P3 at the mask openings 591 and 592, using the main etch step. Because of the uniformity issue, the main etch step may etch beyond top insulating layer O4 and active layer P3, and stop within the insulating layer O3 below the active layer P3.

FIG. 5C shows the structure of FIG. 5B after further etching the vias at mask openings 591 and 592 into the insulating layer O3, using the first over etch step. Because of the uniformity issue, the first over etch step may etch beyond the insulating layer O3, and stop within the active layer P2.

FIG. 5D shows the structure of FIG. 5C after further etching the vias at mask openings 591 and 592 to stop on the target active layer P2, using the second over etch step. As illustrated in FIG. 5D, cumulative variations in thicknesses of active and insulating layers and in etching rate depths have caused a landing error (e.g. 505), such that the via corresponding to mask opening 592 is stopped on the active layer P1, instead of on the target active layer P2. Such landing errors are more likely to occur if more active layers and insulating layers need to be etched for the vias, because of the cumulative variations in thicknesses of active and insulating layers and in etching rate depths.

Figure 6:
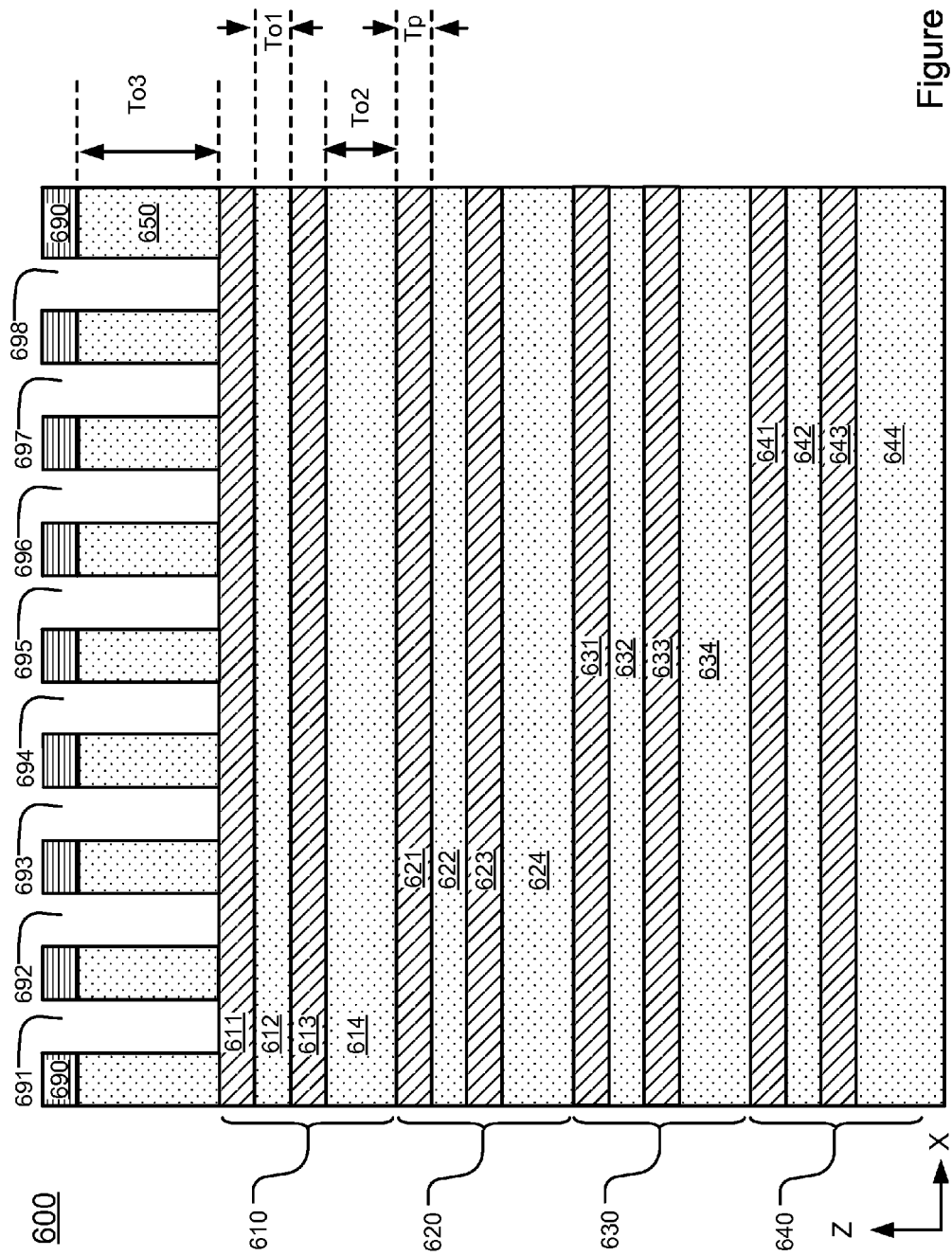
FIGS. 6 through 9 illustrate a manufacturing process for forming a contact structure using the stack of alternating active layers and insulating layers, where the insulating layers have non-simple spatial periods as shown in FIG. 2 in one embodiment.

FIGS. 6 through 9 illustrate a manufacturing process for forming a contact structure using the stack of alternating active layers and insulating layers, where the insulating layers have non-simple spatial periods as shown in FIG. 2 in one embodiment. FIG. 6 is a simplified cross-sectional view of one example of a partially fabricated integrated circuit device 600. As illustrated in FIG. 6, the manufacturing process begins at the stage with forming a stack including alternating active layers and insulating layers, where the insulating layers have non-simple spatial periods including a plurality of sub-stacks (e.g. 610, 620, 630, 640). Each sub-stack (e.g. 610, 620, 630, 640) in the stack includes a first insulating layer (e.g. 612, 622, 632, 642) between a first active layer (e.g. 611, 621, 631. 641) and a second active layer (e.g. 613, 623, 633, 643), and a second insulating layer (e.g. 614, 624, 634, 644) below the second active layer. The second insulating layer has the second EOT (e.g. To2) greater than the first EOT of the first insulating layer (e.g. To1). Although only 4 sub-stacks are shown in FIG. 6, the manufacturing process described herein can apply to more sub-stacks, such as 8, 16, 32, 64, and 128 sub-stacks.

As illustrated in FIG. 6, a top insulating layer (e.g. 650) is formed on the stack, and a first etch mask (e.g. 690) with mask openings (e.g. 691-698) is formed on the top insulating layer. The top insulating layer is etched at the mask openings, to define a plurality of contact locations. A first plurality of vias and a second plurality of vias can be etched in the stack corresponding to the plurality of contact locations for a first plurality of interlayer connectors and a second plurality of interlayer connectors. After the top insulating layer is etched at the mask openings, the first etch mask (e.g. 690) is stripped.

The first plurality of vias includes vias that can be etched to reach respective target depths of the first plurality of vias, and stopped on respective first active layers inside the sub-stacks. In same etching steps as for the first plurality of vias, the second plurality of vias can be etched to reach within a particular depth of respective target depths of the second plurality of vias, where the particular depth includes the first active layer and the first insulating layer in a sub-stack. The second plurality of vias can be further etched through the particular depth to reach the respective target depths of the second plurality of vias, and stopped on respective second active layers inside the sub-stacks.

Figure 7:
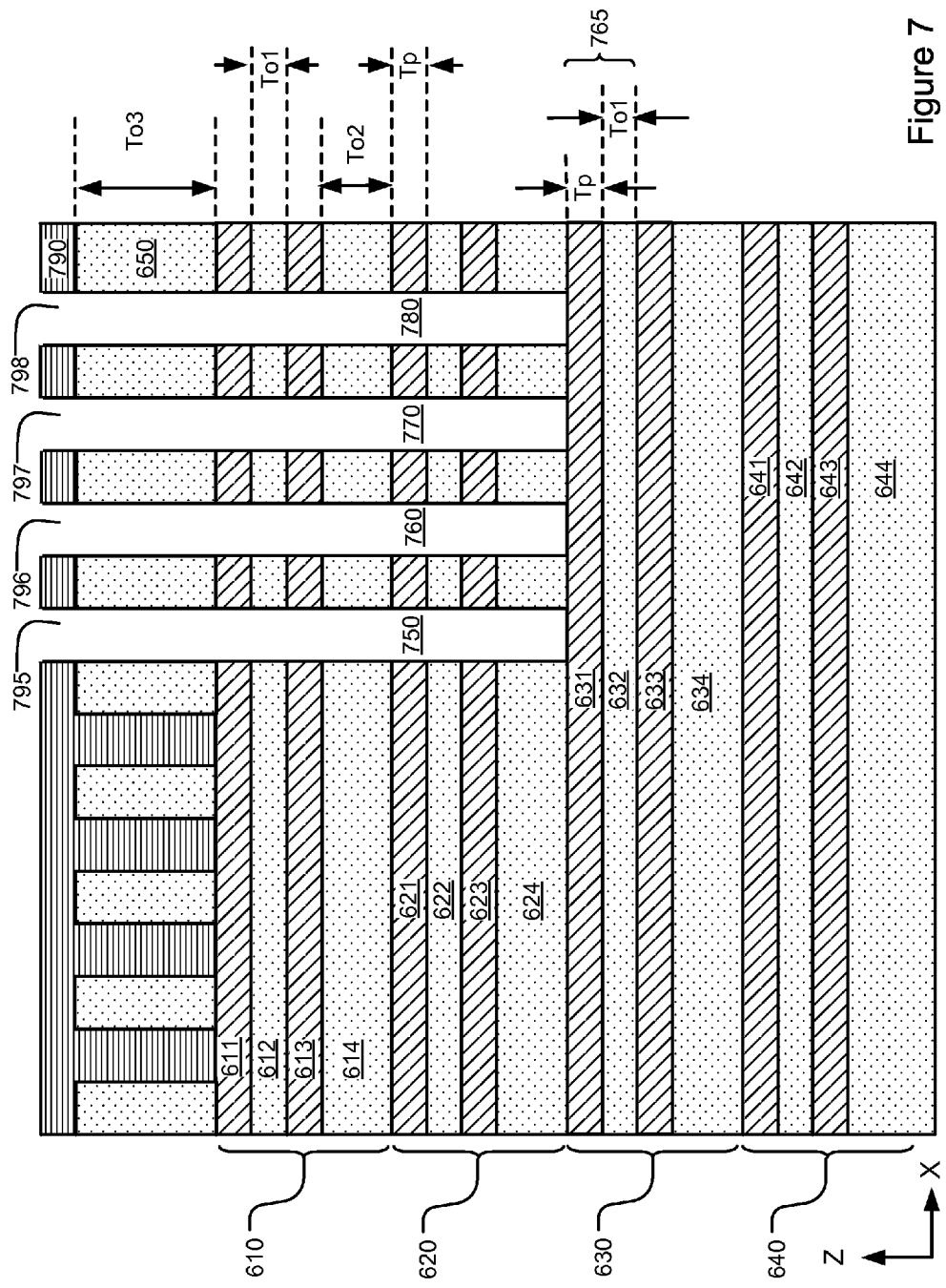

FIG. 7 illustrates a result of etching the structure of FIG. 6 using a second etch mask (e.g. 790) with mask openings (e.g. 795-798) to create vias (e.g. 750, 760, 770, 780) for both the first plurality of vias and the second plurality of vias in the stack. The etching using the second etch mask (e.g. 790) can reach respective target depths of the first plurality of vias (e.g. 750) at the mask openings (e.g. 795), stopping on respective first active layers (e.g. 631) inside the sub-stacks (e.g. 630).

In the same etching step that etches via 750 for the first plurality of vias, via 760 is also etched for the second plurality of vias. However, at this stage, via 760 is only etched to within a particular depth (e.g. 765=Tp+To1) of a respective target depth for via 760 that stops at a second active layer (e.g. 633) inside the sub-stack (e.g. 630). As described in connection with FIG. 9, via 760 will be further etched to reach its target depth that stop at the second active layer (e.g. 633).

After the structure of FIG. 6 is etched using the second etch mask (e.g. 790) at the mask openings, the second etch mask is stripped.

Figure 8:
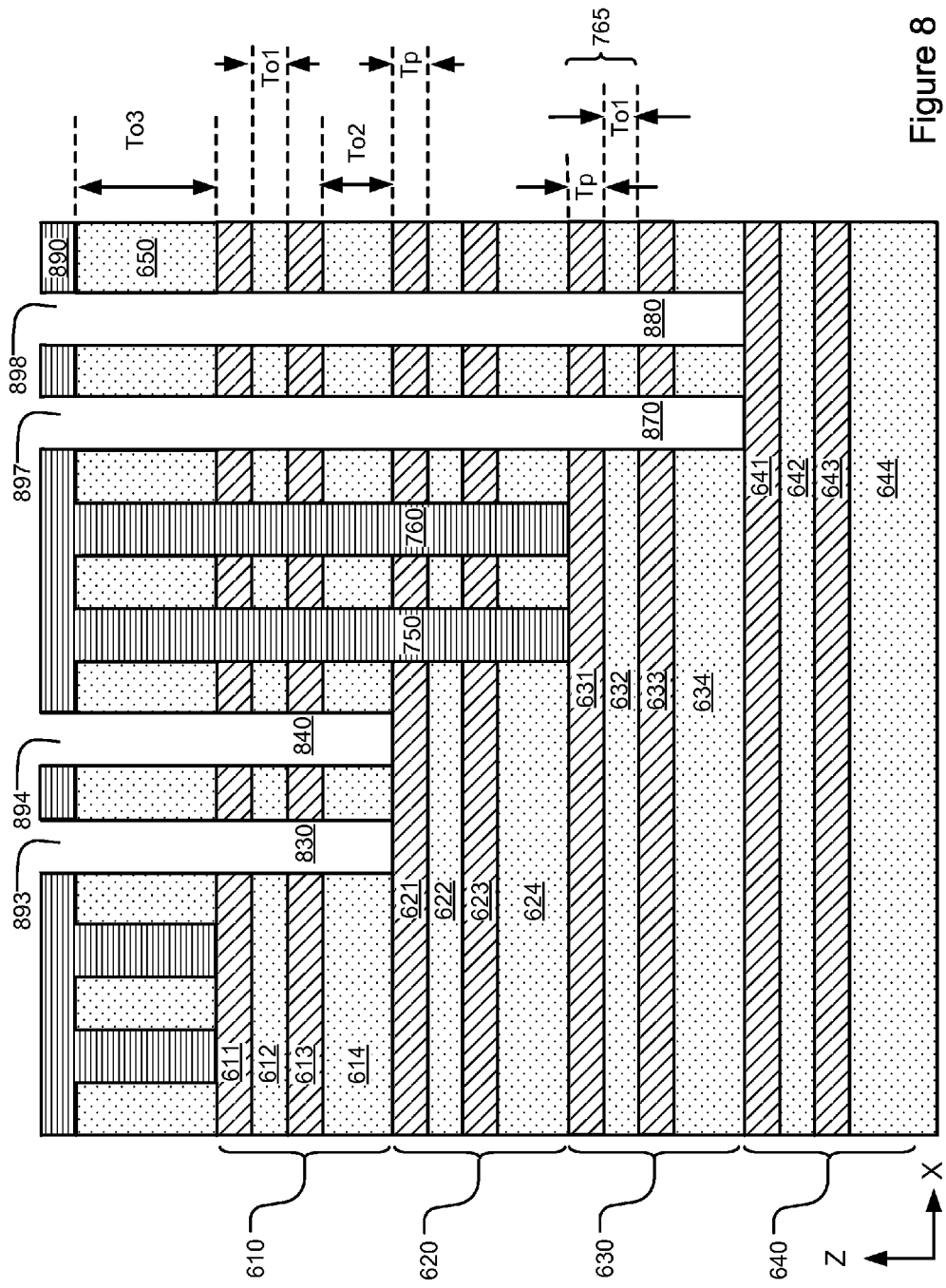

FIG. 8 illustrates a result of etching the structure of FIG. 7 using a third etch mask (e.g. 890) with mask openings (e.g. 893, 894, 897, 898) to create vias (e.g. 830, 840, 870, 880) for both the first plurality of vias and the second plurality of vias in the stack. For one example, the etching using the third etch mask (e.g. 890) can reach respective target depths of the first plurality of vias (e.g. 830) at the mask openings (e.g. 893), stopping on respective first active layers (e.g. 621) inside the sub-stacks (e.g. 620). For another example, the etching using the third etch mask (e.g. 890) can reach respective target depths of the first plurality of vias (e.g. 870) at the mask openings (e.g. 897), stopping on respective first active layers (e.g. 641) inside the sub-stacks (e.g. 640).

In the same etching step that etches vias 830 and 870 for the first plurality of vias, vias 840 and 880 are also etched for the second plurality of vias. However, at this stage, vias 840 and 880 are only etched to within a particular depth (e.g. 765=Tp+To1) of respective target depths for vias 846 and 880 that stop at second active layers (e.g. 623, 643) inside the sub-stacks (e.g. 620, 640). As described in connection with FIG. 9, vias 840 and 880 will be further etched to reach its target depths that stop at the second active layer (e.g. 623, 643).

After the structure of FIG. 7 is etched using the third etch mask (e.g. 890) at the mask openings, the third etch mask is stripped.

Figure 9:
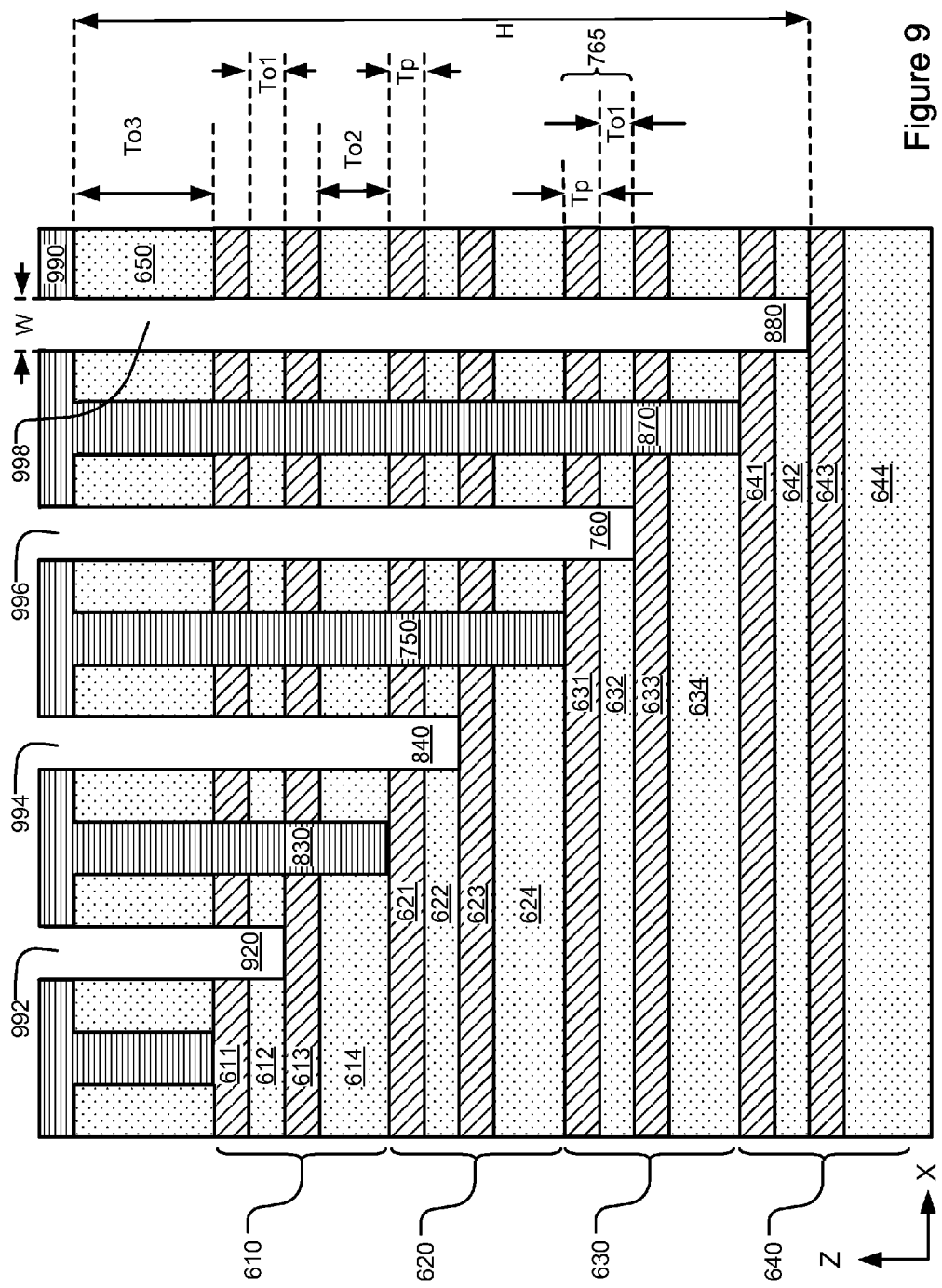

FIG. 9 illustrates a result of etching the structure of FIG. 8 using a fourth etch mask (e.g. 990) with mask openings (e.g. 994, 996, 998) to further etch vias (e.g. 840, 760, 880) that have been partially etched with second and third etch masks to within the particular depth (e.g. 765=Tp+To1) of respective target depths for vias in the second plurality of vias. For example, the etching using the fourth etch mask (e.g. 990) can reach respective target depths of the second plurality of vias (e.g. 840, 760, 880) at the mask openings (e.g. 994, 996, 998), stopping on respective second active layers (e.g. 623, 633, 643) inside the sub-stacks (e.g. 620, 630, 640), respectively.

The etching using the fourth etch mask (e.g. 990) also etches vias (e.g. 920) in sub-stacks on top of the stack (e.g. 920), and stops on respective second active layers (e.g. 613) inside the sub-stacks on top of the stack (e.g. 610).

After the structure of FIG. 8 is etched using the fourth etch mask (e.g. 990) at the mask openings, the fourth etch mask is stripped. Subsequently, the first plurality of interlayer connectors and the second plurality of interlayer connectors (e.g. 172, 173, 174, 175, FIG. 1) can be formed inside vias in the first plurality of vias (e.g. 750, 870) and the second plurality of vias (e.g. 760, 880) extending from a connector surface to the respective first and second active layers (e.g. 631, 641, 633, 643) inside the sub-stacks. Patterned conductor lines (e.g. ML3, FIG. 1) can then be formed on top of the connector surface and connected to respective interlayer connectors.

The structure of FIG. 9 can correspond to a cross section of the device shown in FIG. 1 in the X-Z plane, taken along interlayer connectors (e.g. 172-175).

The example shown by FIGS. 7-9 includes 8 vias reaching 8 corresponding active layers, where 4 vias are in the first plurality of vias stopping on respective first active layers, while 4 other vias are in the second plurality of vias stopping on respective second active layers. Two etch masks (e.g. 790, 890) are used to etch vias in the first plurality of vias, while one etch mask (e.g. 990) is used to etch vias in the second plurality of vias. In general, multiple etch masks can be used to etch vias in the first plurality of vias and stop on respective first active layers inside the sub-stacks. After vias in the first plurality of vias are etched, one more etch mask can be used to etch vias in the second plurality of vias and stop on respective second active layers inside the sub-stacks.

In one implementation, using a set of N etch masks having mask regions and mask openings corresponding to the plurality of contact locations, where $2^N$ is greater than or equal to M, and M is the number of total active layers in the plurality of sub-stacks, the first plurality of vias and the second plurality of vias can be etched by:

for each etch mask n, where n goes from N to 2, etching $2^{n-2}$ sub-stacks at alternating sets of $2^{n-1}$ contact locations for the first plurality of interlayer connectors and the second plurality of interlayer connectors, and stopping on respective first active layers inside the sub-stacks; and for etch mask n=1, etching the second active layer and the second insulating layer of sub-stacks at alternating contact locations for the second plurality of interlayer connectors, and stopping on respective second active layers inside the sub-stacks.

For instance, if N=3 and M=8 as in the example shown by FIGS. 7-9, 8 vias reaching 8 corresponding active layers can be etched by:

for n=3, etching 2 sub-stacks ($2=2^{3-2}$) at alternating sets of 4 contact locations ($4=2^{3-1}$), as illustrated in FIG. 7;

for n=2, etching 1 sub-stacks ($1=2^{2-2}$) at alternating sets of 2 contact locations ($2=2^{2-1}$), as illustrated in FIG. 8; and for n=1, etching the second active layer and the second insulating layer of sub-stacks at alternating contact locations, as illustrated in FIG. 9.

As shown in the example of FIG. 7, a set of 4 contact locations is defined by the etch mask openings 795, 796, 797, and 798 of the etch mask 790. As shown in the example of FIG. 8, a set of 2 contact locations is defined by the etch mask openings 893 and 894, while another set of 2 contact locations is defined by the etch mask openings 897 and 898 of the etch mask 890. As shown in the example of FIG. 9, alternating contact locations are defined by the etch mask openings 992, 994, 996, and 998 of the etch mask 990.

Figure 10:
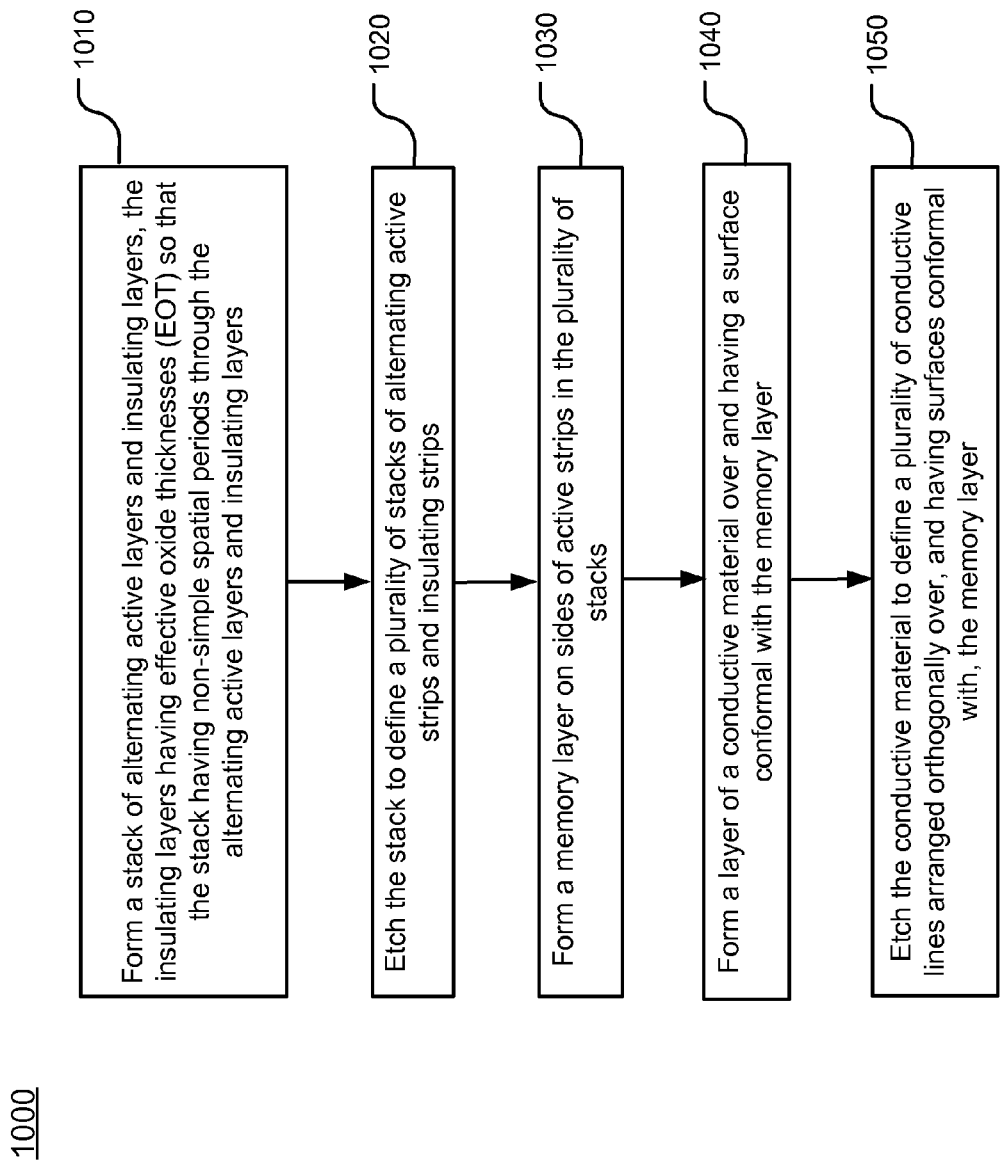
FIG. 10 is a simplified process flow of an example of a method for manufacturing a memory device.

FIG. 10 is a simplified process flow 1000 of an example of a method for manufacturing a memory device. The process steps shown in FIG. 10 begin at a stage with forming a stack of alternating active layers and insulating layers, where the insulating layers have effective oxide thicknesses (EOT) so that the stack has non-simple spatial periods through the alternating active layers and insulating layers (Step 1010).

The insulating layers in the stacks include a first group of layers having a first EOT (e.g. To1, FIG. 2) and a second group of layers having a second EOT (e.g. To2, FIG. 2) that is greater than the first EOT. The insulating layers in the stack alternate in thickness between the first EOT (e.g. To1) and the second EOT (e.g. To2) that is greater than the first EOT. The second EOT (e.g. To2) is greater than a thickness of the active layers (e.g. Tp, FIG. 2).

The stack is etched to define a plurality of stacks of alternating active strips and insulating strips (Step 1020). For instance, the stacks thus defined can include first active strips 211, 221, 231 and 241, second active strips 213, 223, 233 and 243, first insulating strips 212, 222, 232 and 242, and second insulating strips 214, 224, 234 and 244, as shown in FIG. 2. A memory layer (not shown) is formed on sides of active strips in the plurality of stacks, where the memory layer contacts side surfaces of the plurality of conductive strips (Step 1030). A layer of a conductive material (e.g. 290, FIG. 2) is formed over and having a surface conformal with the memory layer on the plurality of stacks (Step 1040). The layer of conductive material is then etched to define a plurality of conductive lines arranged orthogonally over, and having surfaces conformal with, the memory layer on the plurality of stacks, defining a 3D array of memory cells in interface regions at cross-points (e.g. 271, 272, FIG. 2) between side surfaces of the active strips on the stacks and the conductive lines (Step 1050).

Figure 11:
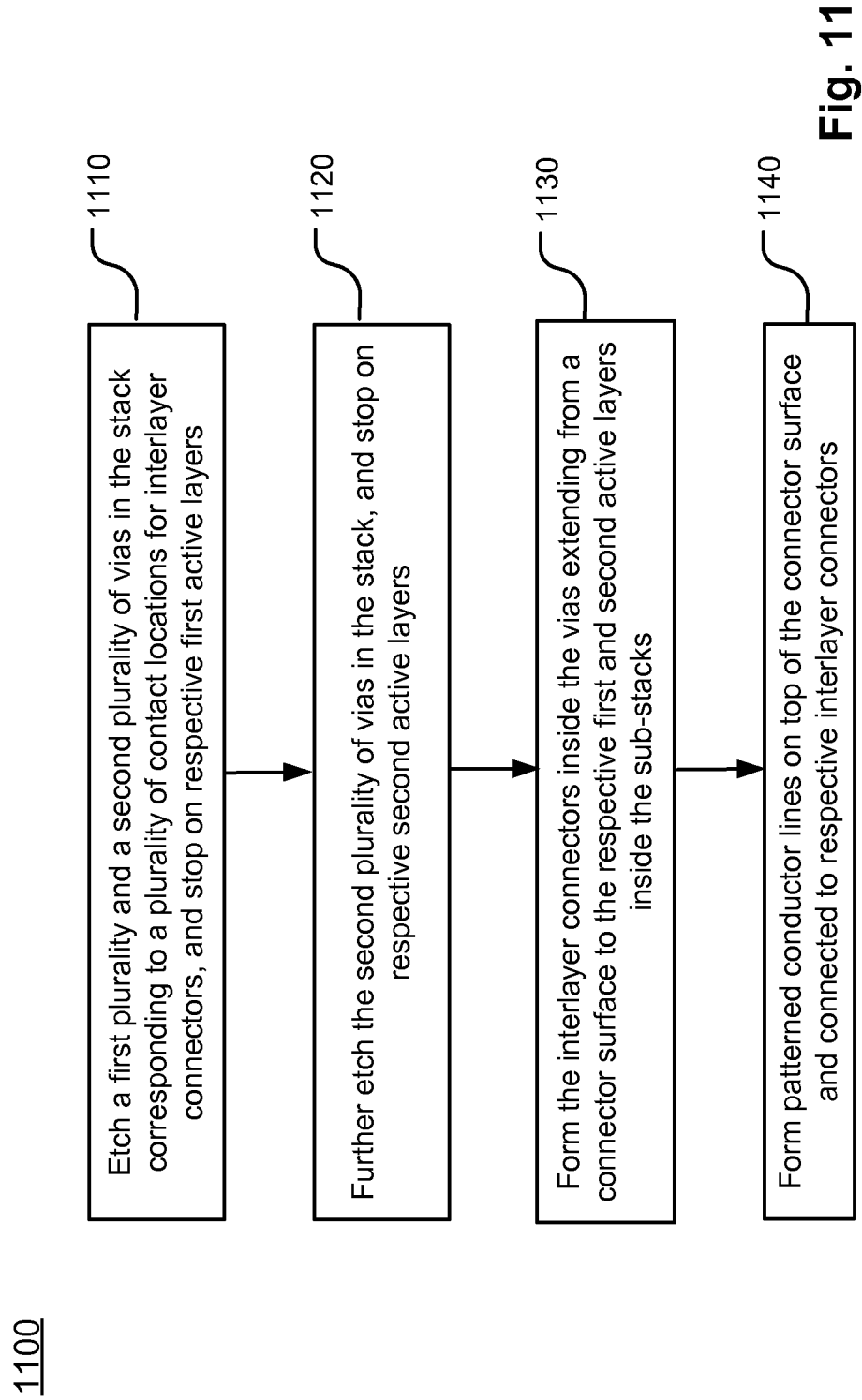
FIG. 11 is a simplified process flow of an example of a method for manufacturing a contact structure in a stack of alternating active layers and insulating layers having non-simple spatial periods.

FIG. 11 is a simplified process flow 1100 of an example of a method for manufacturing a contact structure in a stack of alternating active layers and insulating layers having non-simple spatial periods as described in connection with FIG. 10.

A first plurality of vias and a second plurality of vias are etched in the stack corresponding to a plurality of contact locations (e.g. 691-698, FIG. 6), and stopped on respective first active layers inside the sub-stacks (e.g. 830, 840, 870, 880, FIG. 8) (Step 1110). After Step 1110, the second plurality of vias in the stack is further etched and stopped on respective second active layers inside the sub-stacks (e.g. 940, 960, 870, 980, FIG. 9) (Step 1120).

The etching at Step 1110 can reach respective target depths of the first plurality of vias. For example, the etching at Step 1110 can reach a target depth for via 750, stopping on respective first active layer 631 inside the sub-stack 630 (FIG. 7). The etching at Step 1110 can also reach within a particular depth (e.g. 765=Tp+To1, FIG. 7) of respective target depths of the second plurality of vias, where the particular depth includes the first active layer (e.g. 631) and the first insulating layer (e.g. 632) in a sub-stack (e.g. 630). The further etching at Step 1120 can etch through the particular depth to reach the respective target depths of the second plurality of vias (e.g. 960), stopping on respective second active layer (e.g. 633) inside the sub-stack 630 (FIG. 9).

Interlayer connectors can be formed inside vias in the first plurality of vias and the second plurality of vias extending from a connector surface to the respective first and second active layers inside the sub-stacks (Step 1130). Patterned conductor lines can then be formed on top of the connector surface and connected to respective interlayer connector (Step 1140).

Figure 12:
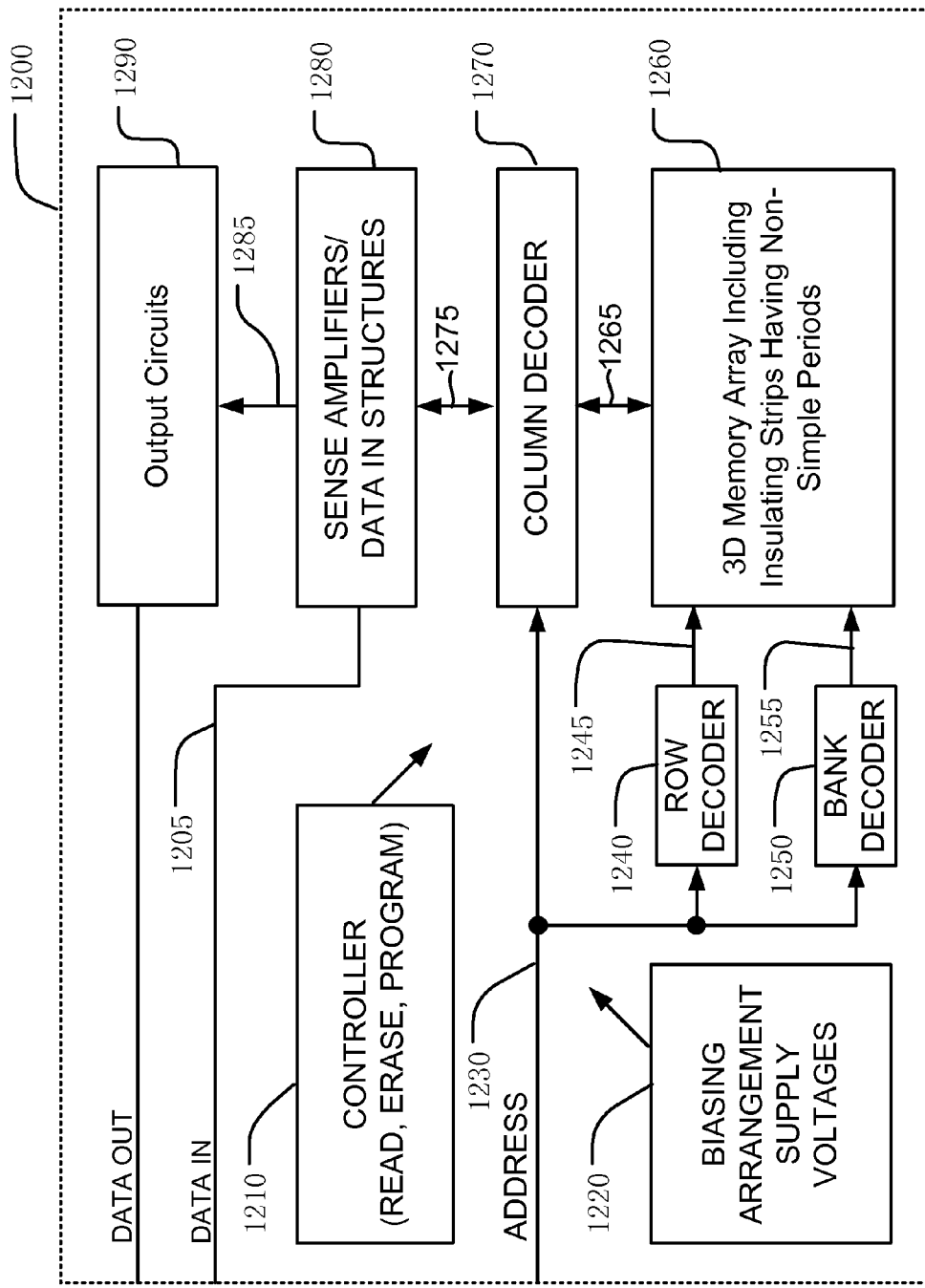
FIG. 12 is a simplified block diagram of an integrated circuit memory device according to an embodiment.

FIG. 12 is a simplified block diagram of an integrated circuit memory device according to an embodiment. The integrated circuit 1200 includes a memory array 1260 on an integrated circuit substrate. The memory array includes a plurality of stacks of alternating active strips and insulating strips, where the insulating strips have effective oxide thicknesses (EOT) so that the stacks have non-simple spatial periods on a line (e.g. 295) through alternating active strips and insulating strips.

A plurality of conductive lines is arranged orthogonally over, and has surfaces conformal with, the plurality of stacks, defining a multi-layer array of interface regions at crosspoints between side surfaces of the active strips in the stacks and the conductive lines. Memory elements (not shown) are disposed in the interface regions, which establish a 3D array of memory cells accessible via the plurality of active strips and the plurality of conductive lines.

The memory array 1260 can include a contact structure that includes a stack of alternating active layers and insulating layers having non-simple spatial periods. The stack can include a plurality of sub-stacks, where each sub-stack in the stack includes a first insulating layer between a first active layer and a second active layer, and a second insulating layer below the second active layer. The second insulating layer has a second effective oxide thickness (EOT) greater than a first EOT of the first insulating layer. The contact structure includes a first plurality of interlayer connectors in the stack stopping on respective first active layers inside the sub-stacks, and a second plurality of interlayer connectors in the stack stopping on respective second active layers inside the sub-stacks.

The contact structure can include a top insulating layer on the stack defining a plurality of contact locations for the first plurality of interlayer connectors and the second plurality of interlayer connectors, where the top insulating layer has a thickness greater than the second EOT of the second insulating layer in a sub-stack. Interlayer connectors in the first plurality of interlayer connectors and the second plurality of interlayer connectors can extend from a connector surface to the respective first and second active layers inside the sub-stacks. The contact structure can include patterned conductor lines on top of the connector surface and connected to respective interlayer connector.

The second EOT of the second insulating layer can be greater than a thickness of the first active layer or the second active layer. A ratio of the second EOT to the first EOT can be between 1.2 and 3.

A row decoder 1240 is coupled to a plurality of word lines 1245, and arranged along rows in the memory array 1260. A column decoder 1270 is coupled to a plurality of bit lines 1265 arranged along columns in the memory array 1260 for reading and programming data from the memory cells in the memory array 1260. A bank decoder 1250 is coupled to a plurality of banks in the memory array 1260 on bus 1255. Multi-bit addresses are supplied on bus 1230 to column decoder 1270, row decoder 1240 and bank decoder 1250. Sense amplifiers and data-in structures in block 1280 are coupled to the column decoder 1270, in this example via data bus 1275. Sensed data from the sense amplifiers are supplied via output data lines 1285 to output circuits 1290. Output circuits 1290 drive the sensed data to destinations external to the integrated circuit 1200. Input data is supplied via the data-in line 1205 from input/output ports on the integrated circuit 1200 or from other data sources internal or external to the integrated circuit 1200, such as a general purpose processor or special purpose application circuitry, or a combination of modules providing system-on-a-chip functionality supported by the memory array 1260, to the data-in structures in block 1280.

In the example shown in FIG. 12, a controller 1210 using a bias arrangement state machine controls the application of bias arrangement supply voltage generated or provided through the voltage supply or supplies in block 1220, such as read, erase, and program voltages. The controller 1210 can include modes of operation for multi-level cell (MLC) programming and reading. The controller 1210 can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

A memory device is described therefore, including a 3D array of memory cells (e.g. 1260) with layers of memory cells separated by insulating strips, where the insulating strips have non-simple periods. The device includes circuitry coupled to the array, responsive to instructions to program, read, and erase data in target cells in a set of memory cells corresponding to a particular multi-bit address supplied on bus 1230 in the array. The set of memory cells includes memory cells disposed between the insulating strips that alternate in thickness between the first EOT and the second EOT that is greater than the first EOT in a stack of memory cells in the array. Interference during operations between adjacent memory cells disposed between such insulating strips that alternate in thickness in a stack of memory cells can be reduced, in comparison to interference between adjacent memory cells separated by insulating strips that only have a constant and thin thickness such as the first EOT, in a stack of memory cells. The particular multi-bit address can be for one or more bytes of data, where one byte includes eight bits of data. The particular multi-bit address can be decoded by column decoder 1270, row decoder 1240 and bank decoder 1250.

The circuitry is configured to receive a program instruction to store data in the set of memory cells corresponding to the particular multi-bit address, and to execute the program operation, including applying program voltages to the memory cells at the particular multi-bit address in the layers of memory cells. The circuitry is configured to receive a read instruction to read data stored in the set of memory cells corresponding to the particular multi-bit address, and to execute the read operation to the memory cells, including applying read voltages to the memory cells at the particular multi-bit address in the layers of memory cells. The circuitry is also configured to receive an erase instruction to erase data stored in the set of memory cells corresponding to a particular multi-bit address, and to execute the erase operation to the memory cells, including applying erase voltages to the memory cells at the particular multi-bit address in the layers of memory cells.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a plurality of stacks of alternating active strips and insulating strips, the insulating strips having effective oxide thicknesses (EOT) so that the stacks have non-simple spatial periods on a line through the alternating active strips and insulating strips;
   a plurality of conductive lines arranged orthogonally over, and having surfaces conformal with, the plurality of stacks, defining a multi-layer array of interface regions at cross-points between side surfaces of the active strips in the stacks and the conductive lines; and
   memory elements in the interface regions, which establish a 3D array of memory cells accessible via the plurality of stacks of active strips and the plurality of conductive lines.

2. The memory device of claim 1, wherein the insulating strips in the stacks include a first group of strips having a first EOT and a second group of strips having a second EOT that is greater than the first EOT.

3. The memory device of claim 1, wherein the insulating strips in the stacks alternate in thickness between a first EOT and a second EOT that is greater than the first EOT.

4. The memory device of claim 3, comprising circuitry coupled to the 3D array of memory cells, and a set of memory cells corresponding to a particular multi-bit address, wherein the set includes memory cells disposed between the insulating strips that alternate in thickness between the first EOT and the second EOT in a stack of memory cells in the 3D array of memory cells, the circuitry configured to:
   receive a program instruction to store data in the set of memory cells, and execute the program instruction to the memory cells in the set;
   receive a read instruction to read data stored in the set of memory cells, and execute the read instruction to the memory cells in the set; and
   receive an erase instruction to erase data stored in the set of memory cells, and execute the erase instruction to the memory cells in the set.

5. The memory device of claim 2, wherein a ratio of the second EOT to the first EOT is between 1.2 and 3.

6. The memory device of claim 2, wherein the first EOT is between 15 nanometers and 30 nanometers.

7. The memory device of claim 2, wherein the second EOT is between 25 nanometers and 50 nanometers.

8. The memory device of claim 1, wherein the stacks of alternating active strips and insulating strips include a plurality of sub-stacks, each sub-stack in the plurality of sub-stacks includes a first insulating strip between a first active strip and a second active strip, and a thickness of the first active strip or the second active strip is between 15 nanometers and 30 nanometers.

9. The memory device of claim 2, comprising a top insulating layer on the stack, wherein the top insulating layer has a third EOT greater than the second EOT.

10. The memory device of claim 1, comprising:
    a stack of alternating active layers and insulating layers, the insulating layers having effective oxide thicknesses (EOT) so that the stack has non-simple spatial periods through the alternating active layers and insulating layers, wherein the stack includes a plurality of sub-stacks of alternating active layers and insulating layers, and each sub-stack in the stack includes a first insulating layer between a first active layer and a second active layer, and a second insulating layer below the second active layer and having a second EOT that is greater than a first EOT of the first insulating layer; and
    a first plurality of interlayer connectors in the stack of alternating active layers and insulating layers stopping on respective first active layers inside the sub-stacks, and a second plurality of interlayer connectors in the stack stopping on respective second active layers inside the sub-stacks.

11. The memory device of claim 10, comprising:
    a top insulating layer on the stack defining a plurality of contact locations for the first plurality of interlayer connectors and the second plurality of interlayer connectors, wherein the top insulating layer has a third EOT greater than the second EOT.

12. The memory device of claim 10, wherein interlayer connectors in the first plurality of interlayer connectors and the second plurality of interlayer connectors extend from a connector surface to the respective first and second active layers inside the sub-stacks, comprising:
   patterned conductor lines on top of the connector surface and connected to respective interlayer connectors.

13. A method for manufacturing a memory device, comprising:
   forming a stack of alternating active layers and insulating layers, the insulating layers having effective oxide thicknesses (EOT) so that the stack have non-simple spatial periods on a line through the alternating active layers and insulating layers;
   etching the stack to define a plurality of stacks of alternating active strips and insulating strips, the insulating strips having effective oxide thicknesses (EOT) so that the stacks have non-simple spatial periods on a line through the alternating active strips and insulating strips;
   forming a memory layer on sides of active strips in the plurality of stacks, the memory layer contacting side surfaces of the plurality of conductive strips;
   forming a layer of conductive material over and having a surface conformal with the memory layer on the plurality of stacks; and
   etching the layer of conductive material to define a plurality of conductive lines arranged orthogonally over, and having surfaces conformal with, the memory layer on the plurality of stacks, defining a multi-layer array of memory cells in interface regions at cross-points between side surfaces of the active strips in the stacks and the conductive lines,
   wherein memory elements in the interface regions establish a 3D array of memory cells accessible via the plurality of stacks of active strips and the plurality of conductive lines.

14. The method of claim 13, wherein the insulating strips in the stacks of alternating active strips and insulating strips include a first group of strips having a first EOT and a second group of strips having a second EOT that is greater than the first EOT.

15. The method of claim 13, wherein the insulating strips in the stacks of alternating active strips and insulating strips alternate in thickness between a first EOT and a second EOT that is greater than the first EOT.

16. The method of claim 15, wherein a ratio of the second EOT to the first EOT is between 1.2 and 3.

17. The method of claim 15, wherein the first EOT is between 15 nanometers and 30 nanometers, and the second EOT is between 25 nanometers and 50 nanometers.

18. The method of claim 13, wherein the stack of alternating active layers and insulating layers include a plurality of sub-stacks, each sub-stack in the plurality of sub-stacks includes a first insulating layer between a first active layer and a second active layer, and a thickness of the first active layer or the second active layer is between 15 nanometers and 30 nanometers.

19. The method of claim 13, wherein the stack of alternating active layers and insulating layers include a plurality of sub-stacks, each sub-stack in the plurality of sub-stacks includes a first insulating layer between a first active layer and a second active layer, comprising:
   etching a first plurality of vias and a second plurality of vias in the stack corresponding to a plurality of contact locations for a first plurality of interlayer connectors and a second plurality of interlayer connectors, and stopping on respective first active layers inside the sub-stacks; and
   after said stopping on respective first active layers, further etching the second plurality of vias in the stack, and stopping on respective second active layers inside the sub-stacks.

20. The method of claim 19, wherein said etching a first plurality of vias and a second plurality of vias reaches respective target depths of the first plurality of vias, and said further etching the second plurality of vias reaches respective target depths of the second plurality of vias.

21. The method of claim 19, said further etching the second plurality of vias includes etching vias in sub-stacks on top of the stack, and stopping on respective second active layers inside the sub-stacks on top of the stack.

22. The method of claim 19, comprising etching a top insulating layer on the stack, to define the plurality of contact locations, wherein the top insulating layer has a third EOT greater than the second EOT.

23. The method of claim 19, comprising:
   forming the first plurality of interlayer connectors and the second plurality of interlayer connectors inside vias in the first plurality of vias and the second plurality of vias extending from a connector surface to the respective first and second active layers inside the sub-stacks; and
   forming patterned conductor lines on top of the connector surface and connected to respective interlayer connectors.

24. The method of claim 19, wherein said etching and said further etching include using a set of N etch masks, the etch masks having mask regions and mask openings corresponding to the plurality of contact locations, wherein $2^N$ is greater than or equal to M and M is a number of total active layers in the plurality of sub-stacks, comprising:
   for each etch mask n, where n goes from N to 2, etching $2^{n-2}$ sub-stacks at alternating sets of $2^{n-1}$ contact locations for the first plurality of interlayer connectors and the second plurality of of interlayer connectors, and stopping on respective first active layers inside the sub-stacks; and
   for etch mask n=1, etching the second active layer and a second insulating layer of sub-stacks below the second active layer at alternating contact locations for the second plurality of interlayer connectors, and stopping on respective second active layers inside the sub-stacks.

* * * * *